United States Patent [19]
Lowell

[11] Patent Number: 5,581,194
[45] Date of Patent: Dec. 3, 1996

[54] METHOD AND APPARATUS FOR PASSIVE OPTICAL CHARACTERIZATION OF SEMICONDUCTOR SUBSTRATES SUBJECTED TO HIGH ENERGY (MEV) ION IMPLANTATION USING HIGH-INJECTION SURFACE PHOTOVOLTAGE

[75] Inventor: John K. Lowell, Round Rock, Tex.

[73] Assignee: Advanced Micro Devices, Inc., Sunnyvale, Calif.

[21] Appl. No.: 473,193

[22] Filed: Jun. 7, 1995

[51] Int. Cl.$^6$ ................................. G01R 31/302
[52] U.S. Cl. ........................................ 324/752
[58] Field of Search ........................... 324/751–752; 250/310–311

[56] References Cited

U.S. PATENT DOCUMENTS

| | | | |
|---|---|---|---|
| 4,454,472 | 6/1984 | Moore | 324/765 |
| 4,563,642 | 1/1986 | Munakata et al. | 324/752 |
| 4,567,431 | 1/1986 | Goodman | 324/752 |
| 4,827,212 | 5/1989 | Kamieniecki | 324/765 |
| 5,025,145 | 6/1991 | Lagowski | 250/214 R |
| 5,177,351 | 1/1993 | Lagowski | 250/215 |
| 5,260,648 | 11/1993 | Brust | 324/158.1 |

OTHER PUBLICATIONS

Lagowski et al., "Non–Contact Mapping of Heavy Metal Contamination for Silicon IC Fabrication," *IOP Publishing, Ltd.*, (1992), pp. A185–A192 (month unavailable).

P. Edelman et al., "Surface Charge Imaging in Semiconductor Wafers by Surface Photovoltage (SPV)," *Proceedings of the Materials Research Society Meeting*, San Francisco, California (Apr., 1992).

Borland et al., "MeV Implantation Technology: Next Generation Manufacturing with Current–Generation Equipment," *Solid State Technology*, (Dec., 1993), pp. 1–8.

*Primary Examiner*—Ernest F. Karlsen
*Assistant Examiner*—Russell M. Kobert
*Attorney, Agent, or Firm*—Kevin L. Daffer; Conley, Rose & Tayon

[57] ABSTRACT

The method and apparatus of the present invention provides a fast, efficient, non-contact, non-destructive means of characterizing surface and near-surface regions of a semiconductor substrate subjected to high-energy (MeV) ion implantation through interpretation of a graph of surface charge versus modulation frequency of incident monochromatic light. The near-surface region of a semiconductor substrate is defined to extend from just below the surface of the semiconductor substrate to a depth of 0.8 μm. Similar to existing SPV/SCI techniques, a semiconductor substrate is radiated with high photon energy such that energy bands become almost flat at the surface of the semiconductor substrate. Surface photovoltages produced at different modulation frequencies of incident light pulses are measured and recorded. Resultant surface charges are derived from measured surface photovoltages, and a graph is made of surface charge versus the modulation frequency of incident light pulses. Structural and material defects affecting the characteristics of the surface and near-surface regions of the semiconductor substrate may then be diagnosed from the resulting graph.

7 Claims, 9 Drawing Sheets

METHOD AND APPARATUS FOR PASSIVE OPTICAL CHARACTERIZATION OF SEMICONDUCTOR SUBSTRATES SUBJECTED TO HIGH ENERGY (MEV) ION IMPLANTATION USING HIGH-INJECTION SURFACE PHOTOVOLTAGE

BACKGROUND OF THE INVENTION

1. Field of the Invention

This invention relates to a method and apparatus for the characterization of surface and near-surface regions of a semiconductor substrate.

2. Description of the Relevant Art

Ion implantation is a process in which energetic, charged atoms or molecules are directly introduced into a semiconductor substrate. Ion implantation is primarily used to add dopant ions into the surfaces of semiconductor substrates. As semiconductor device dimensions shrink, ion implantation is steadily replacing chemical (diffusion) doping due primarily to the ability to more precisely control the doping process.

High-energy ion implantation, with acceleration energies measured in millions of electron volts (MeV), has shown the potential to reduce manufacturing costs of advanced complementary metal oxide semiconductor (CMOS) integrated circuits with minimum device dimensions of 0.5 µm and smaller. High-energy ion implantation offers the potential use of impurity implants in relatively low-temperature gettering schemes, possibly allowing more expensive silicon epitaxial wafers to be replaced by less expensive Czochralski (CZ) bulk silicon wafers.

In high-energy ion implementation, impurities are driven into the substrate to depths of a few micrometers (microns). Localized damage to the crystalline lattice of a monolithic CZ silicon wafer during high-energy ion implantation may be recovered (annealed out) at relatively low temperatures.

High-energy ion implantation of oxygen atoms may replace the standard heat-cool-heat temperature cycling of CZ silicon wafers to produce intrinsic gettering sites. As a CZ silicon wafer is heated during an annealing process following oxygen ion implantation, oxygen clusters may grow into precipitates large enough to form desired lattice dislocations (gettering sites) in the wafer bulk at the implant depth. These gettering sites trap unwanted impurities which, if located in the active regions of devices near the surface of the wafer, would lower device performance and yield.

The formation of gettering sites just below the active regions of devices serves to increase their ability to trap unwanted impurities which might otherwise find their way into device active regions. Thus, under the right conditions, the use of high-energy ion implantation to place an implant layer in a CZ silicon wafer at a depth of a few microns may result in a "clean" and defect-free zone from the surface of the wafer to the implant depth. A semiconductor wafer with these characteristics is highly desirable for the manufacture of advanced integrated circuits with minimum device dimensions of 0.5 µm and smaller.

Common techniques used to characterize implanted semiconductor substrates include secondary ion mass spectroscopy (SIMS), transmission electron microscopy (TEM), and various electrical tests. SIMS and TEM techniques are destructive in nature, and are relatively expensive in terms of time and materials expended. Electrical tests require test structures to be constructed on wafer surfaces, and are thus also relatively expensive in terms of time and materials.

More modern surface photovoltage (SPV) techniques to characterize implanted semiconductor substrates are nondestructive, require no special test structures, and may be performed relatively quickly. SPV techniques for detecting the presence of heavy metal contaminants in semiconductor substrates are well known. In brief, a train of monochromatic light pulses is directed at a semiconductor surface. If the energy of the incident light (photons) is greater than the bandgap of the semiconductor material, $E_g$, photons penetrating the semiconductor material are eventually absorbed, producing excess charge carriers (holes and electrons) within the semiconductor substrate. These excess charge carriers diffuse to the surface of the semiconductor substrate, where they become separated by the electric field of the surface space charge region and produce a surface photovoltage. Knowing the photon flux and the absorption coefficient, the (average) minority carrier diffusion length may then be determined. U.S. Pat. No. 4,567,431; U.S. Pat. No. 5,025,145 (herein incorporated by reference). Heavy metal contaminants are known to reduce minority carrier diffusion lengths. Lagowski, et al., "Non-Contact Mapping of Heavy Metal Contamination for Silicon IC Fabrication," IOP Publishing, Ltd. 1992, pp. A185–A192 (herein incorporated by reference).

FIG. 1 shows a block diagram of an SPV test apparatus 100 for determining the minority carrier diffusion length in a semiconductor substrate 102 based on the relationship between incident photon flux and resulting surface photovoltage. Light source 104 includes an illumination source 106 and a rotating chopper 108. Light source 104 also includes an illumination attenuator and a set of filters for wavelength selection (not shown).

Rotating chopper 108 of light source 104 modulates a beam of monochromatic light 110 produced by illumination source 106. Light source 104 thus produces a train of monochromatic light pulses 112 with constant photon flux at each available wavelength. The train of monochromatic light pulses 112 passes through a housing 114 and strikes the surface of semiconductor substrate 102 resting on electrically grounded base plate 116. Pickup electrode 118 sends an electrical signal reflecting the level of the surface photovoltage of semiconductor substrate 102 to lock-in amplifier 120. Lock-in amplifier 120 is synchronized with rotating chopper 108 of light source 104 via an electrical signal from light source 104. Lock-in amplifier 120 provides an output signal reflecting the resultant level of surface photovoltage produced by semiconductor substrate 102 to data processor 122. Data processor 122 processes the input surface photovoltages produced at several different photon energy levels (i.e., wavelengths of incident light) to determine the minority carrier diffusion length in semiconductor substrate 102.

FIG. 2 shows that photons of the train of monochromatic light pulses 112 penetrate into semiconductor substrate 102 before absorption takes place. Typical SPV test apparatus use wavelengths of incident light which penetrate silicon semiconductor wafers to depths of from 10 µm to 150 µm.

FIG. 3 illustrates graphically how SPV test techniques work. The beam of monochromatic light 110 with constant photon flux φ is modulated by rotating chopper 108 of light source 104 to produce a train of monochromatic light pulses 112. The train of monochromatic light pulses 112 has an associated modulation period 'T' and modulation frequency 'f', where f=1/T, and modulation frequency 'f' of the train of monochromatic light pulses 112 is not related to the wavelength or frequency of the beam of monochromatic light 110.

More modern SPV techniques advocate fixed light beam modulation frequencies in the 500–600 Hz range in order to suppress hysteresis effects caused by trapping of minority carriers by deep levels and by surface states. Earlier SPV techniques used a fixed modulation frequency of about 10 Hz. See J. Lagowski, et al., "Non-Contact Mapping of Heavy Metal Contamination for Silicon IC Fabrication," IOP Publishing Ltd., 1992, pp. A185–A192 (herein incorporated by reference).

If the energy of the incident light (photons) is greater than the bandgap of the semiconductor material, $E_g$, photons penetrating the semiconductor material are eventually absorbed, producing excess charge carriers (holes and electrons) within the semiconductor substrate. These excess charge carriers diffuse to the surface of the semiconductor substrate, where they become separated by the electric field of the surface space charge region and produce a surface photovoltage. In a semiconductor substrate doped with p-type material, surface photovoltage increases when an incident light pulse strikes the surface of the semiconductor substrate, and decreases when the light is blocked by rotating chopper 108 of light source 104. In a semiconductor substrate doped with n-type material, surface photovoltage decreases when an incident light pulse strikes the surface of the semiconductor substrate, and increases when the light is blocked by rotating chopper 108 of light source 104. Note that the number of excess charge carriers and the surface photovoltage would reach an equilibrium condition under continuous incident photon flux.

The monolithic crystalline lattice structure of a semiconductor substrate may develop a defect during the manufacture of the substrate or during subsequent device fabrication steps. As used herein, the term defect refers to any non-uniform material or structure present within a monolithic crystalline substrate which may negatively impact device performance. Among the most important device and substrate properties relevant to CMOS devices and influenced by crystalline defects include leakage currents in p-n junctions, minority carrier lifetimes, gate-oxide quality, and threshold voltage uniformity.

Material or structural defects may be present in the initial substrate starting material, or may be introduced into the substrate during fabrication of the substrate or during device fabrication processing steps. Exemplary defect materials include electrically active metal contaminants such as copper (Cu) and iron (Fe). Structural defects include point defects such as vacancies, line defects such as dislocation loops, and area defects such as stacking faults.

Structural defects are created within semiconductor substrates during ion implantation. An annealing process following ion implantation may not repair all of the damage caused to the crystalline lattice. Other device fabrication steps may also introduce material or structural defects which may lower device performance and yield. Thus it is important to be able to detect the presence of defects at any step in the device fabrication process.

FIG. 4 shows a semiconductor substrate 402, in which an implant layer 404 has been formed at a depth of 1 μm using high-energy (MeV) ion implantation, undergoing an SPV test procedure. The train of monochromatic light pulses 112 of a typical SPV test apparatus penetrates silicon semiconductor wafers to depths of from 10 μm to 150 μm as shown. One of the problems with using conventional SPV test methods to determine the average minority carrier diffusion length of a semiconductor substrate 402 is that any defects at the implant depth caused by ion implantation may create recombination centers. These recombination centers may prevent many minority charge carriers produced below the implant layer from reaching the surface of the semiconductor substrate and producing a surface photovoltage.

A non-contact, non-destructive test method would allow substrates to be tested for defects before and after each step in a device fabrication process. Such a method would also allow sources of defects to be determined. Additionally, the relative success of an annealing process in repairing structural defects caused by ion implantation could be determined. It would further be advantageous to provide a method for characterizing the surface and near-surface regions of as-processed semiconductor substrates subjected to high-energy ion implantation using the advantages of SPV techniques, but without having to incur the burdensome disadvantages associated with the determination of minority carrier diffusion length. The problems of plotting the reciprocal of the induced photon flux surface photovoltage versus the reciprocal of the absorption coefficient, determining and rejecting non-linear points, and extrapolating along a straight line to determine minority carrier diffusion length would thus be avoided, potentially making the method more efficient and rapid.

Surface charge imaging (SCI) is a technique which uses SPV methods and high photon excitation levels. Under high photon excitation, energy bands become almost flat at the surface of a semiconductor wafer under test. Surface charge is then derived from measured surface photovoltage using an accepted equation described by P. Edelman, et al., "Surface Charge Imaging in Semiconductor Wafers by Surface Photovoltage (SPV)," Proceedings of the Materials Research Society Meeting, San Francisco, Calif., April, 1992 (incorporated herein by reference).

The P. Edelman et al. article describes an SCI technique which uses high-intensity laser light to map areas of varying surface charge on a semiconductor substrate. A fixed light modulation frequency of about 1.0 kHz is used in order to minimize interface state trapping. The technique is non-contact, non-destructive, and does not require the determination of minority carrier diffusion length, but was developed for a single purpose and does not allow for full characterization of the surface and near-surface region of as-processed semiconductor substrates.

SUMMARY OF THE INVENTION

The problems outlined above are in large part solved by the method and apparatus of the present invention. That is, a method is provided for characterizing the surface and near-surface regions of as-processed semiconductor substrates subjected to high-energy ion implantation. As defined herein, the near-surface region of a semiconductor substrate extends from just below the surface of the semiconductor substrate to a depth (i.e., elevation level relative to the surface) of 0.8 μm. The method employs SPV techniques, but without requiring the determination of minority carrier diffusion length. Moreover, the method purposefully avoids the SPV steps of plotting the reciprocal of the induced surface photovoltage versus the reciprocal of the absorption coefficient, determining and rejecting nonlinear points, and extrapolating along a straight line to determine minority carrier diffusion length. By measuring and recording surface photovoltages produced at different modulation frequencies of incident light pulses, deriving resultant surface charges from measured surface photovoltages, and plotting surface charge versus the modulation frequency of incident light pulses, the present methodology achieves a more efficient and faster characterization of surface and near-surface regions of as-processed semiconductor substrates.

The present invention also overcomes the problem of recombination center effects on conventional SPV methods. In high-energy ion implementation, impurities are driven into the substrate to depths of a few microns. Any defects at the implant depth caused by ion implantation may create recombination centers. These recombination centers may prevent many minority charge carriers produced below the implant layer from reaching the surface of the semiconductor substrate and producing a surface photovoltage. Typical SPV test apparatus use wavelengths of light which penetrate semiconductor substrates to depths of from 10 µm to 150 µm. Thus many minority charge carriers produced by typical SPV test apparatus may never reach the surface of the semiconductor substrate to produce a surface photovoltage.

Broadly speaking, the present invention contemplates a fast, efficient, non-contact, non-destructive method for the characterization of surface and near-surface regions of an as-processed semiconductor substrate, and an apparatus with which to carry out this method. Similar to existing SPV/SCI techniques, a semiconductor substrate is radiated with high photon energy such that energy bands become almost flat at the surface of the semiconductor substrate. The resulting surface photovoltages are measured and recorded. Resultant surface charge values are derived from measured surface photovoltages using an accepted equation. Surface charge values are then plotted against the corresponding modulation frequencies of incident light pulses. Structural and material defects affecting the characteristics of the surface and near-surface regions of the semiconductor substrate may then be diagnosed from the resulting graph.

BRIEF DESCRIPTION OF THE DRAWINGS

Other objects and advantages of the invention will become apparent upon reading the following detailed description and upon reference to accompanying drawings in which.

Figure 1:
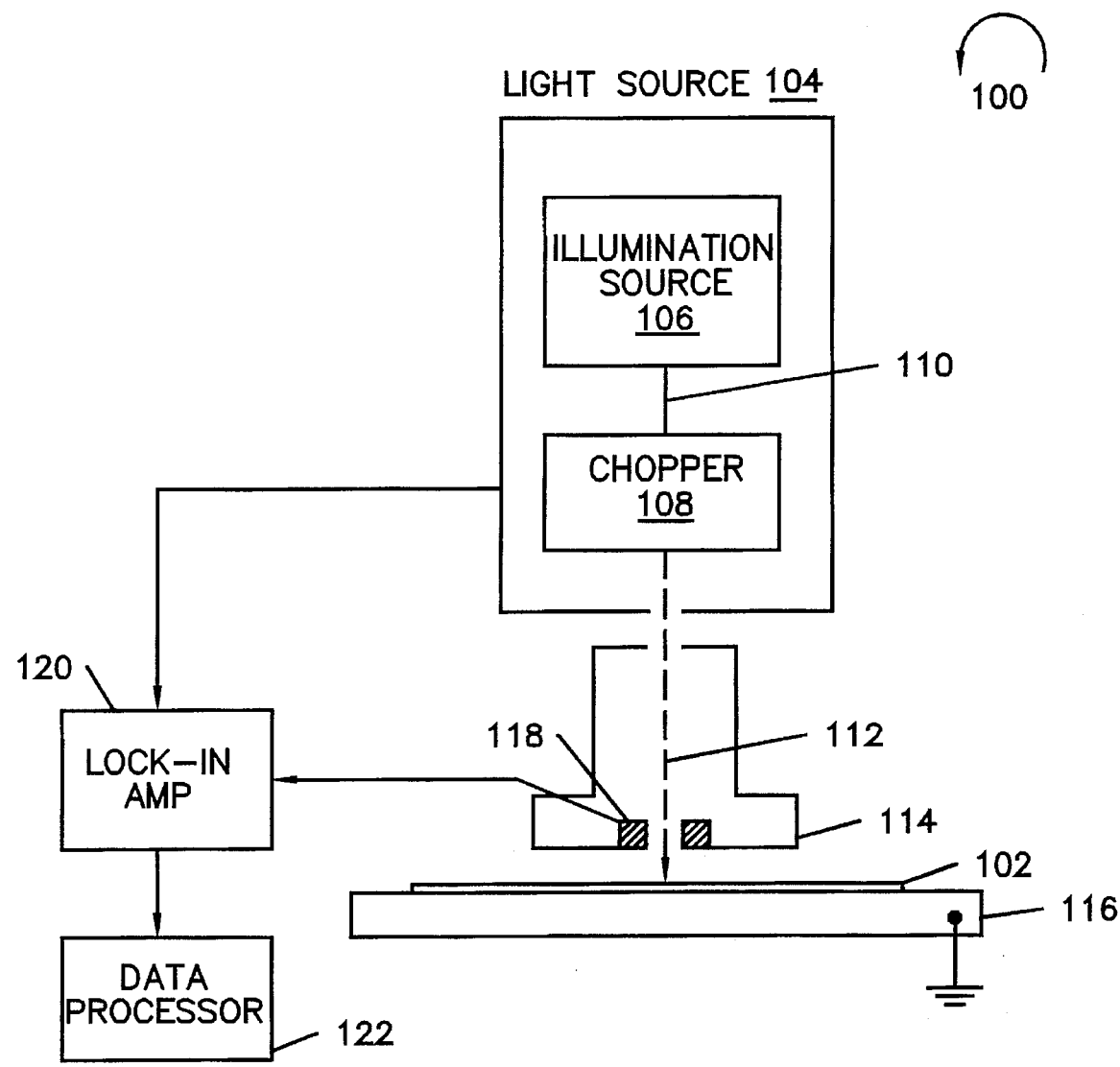
FIG. 1 shows a block diagram of an SPV test apparatus for determining the minority carrier diffusion length in a semiconductor substrate.
Figure 2:
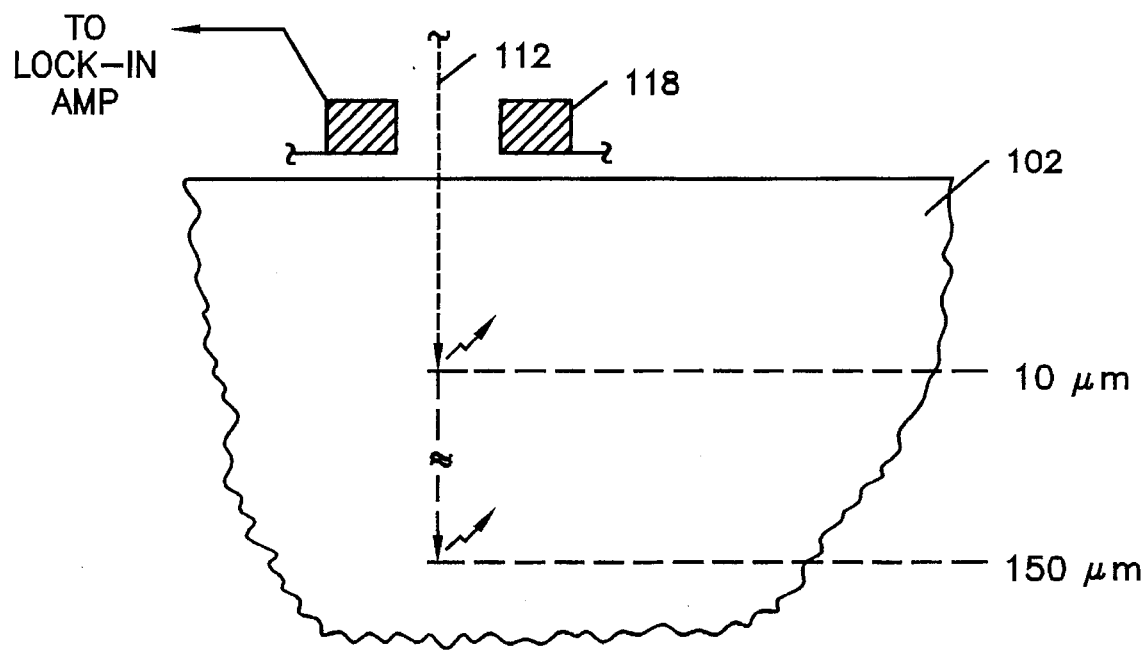
FIG. 2 illustrates how the photon energy level (i.e., wavelength) of a train of monochromatic light pulses determines the depth of photon penetration into a semiconductor substrate.
Figure 3:
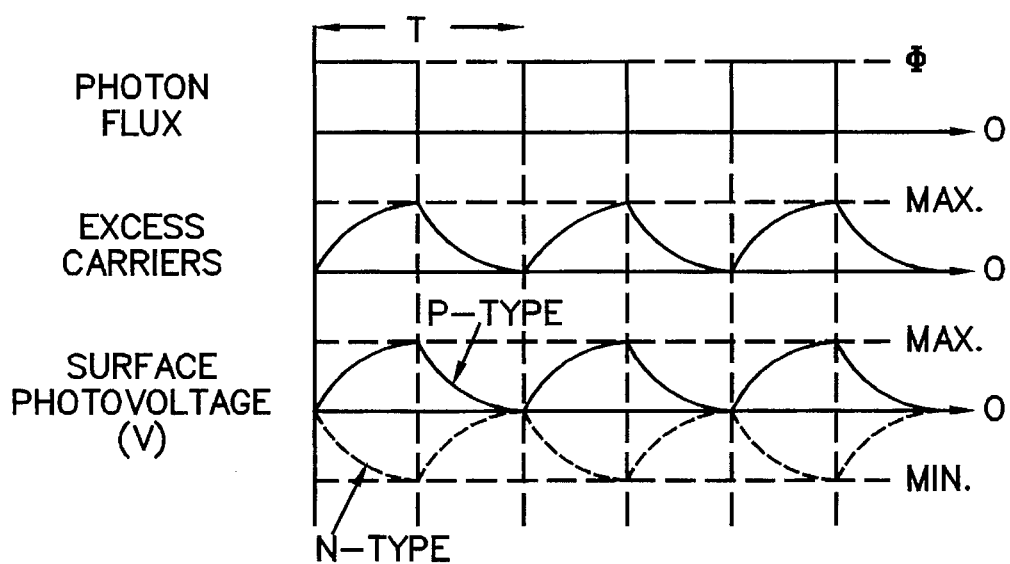
FIG. 3 illustrates graphically how SPV test techniques work.
Figure 4:
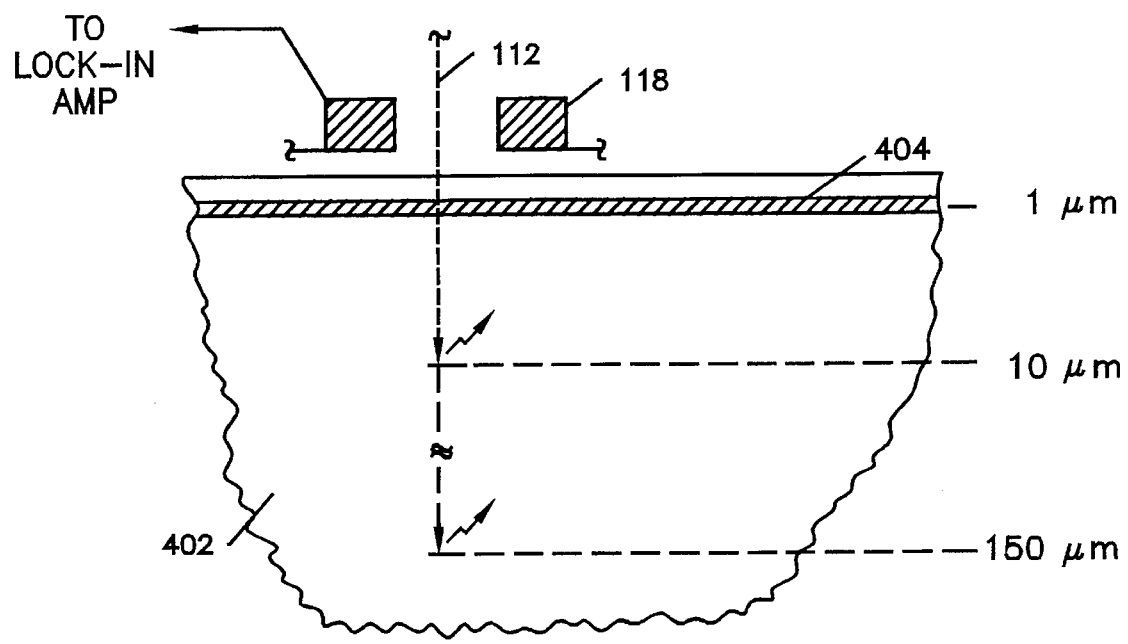
FIG. 4 shows a semiconductor substrate with an MeV implant layer undergoing an SPV test procedure.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents, and alternatives falling within the spirit and scope of the present invention as defined by the appended claims.

DETAILED DESCRIPTION OF THE INVENTION

Figure 5:
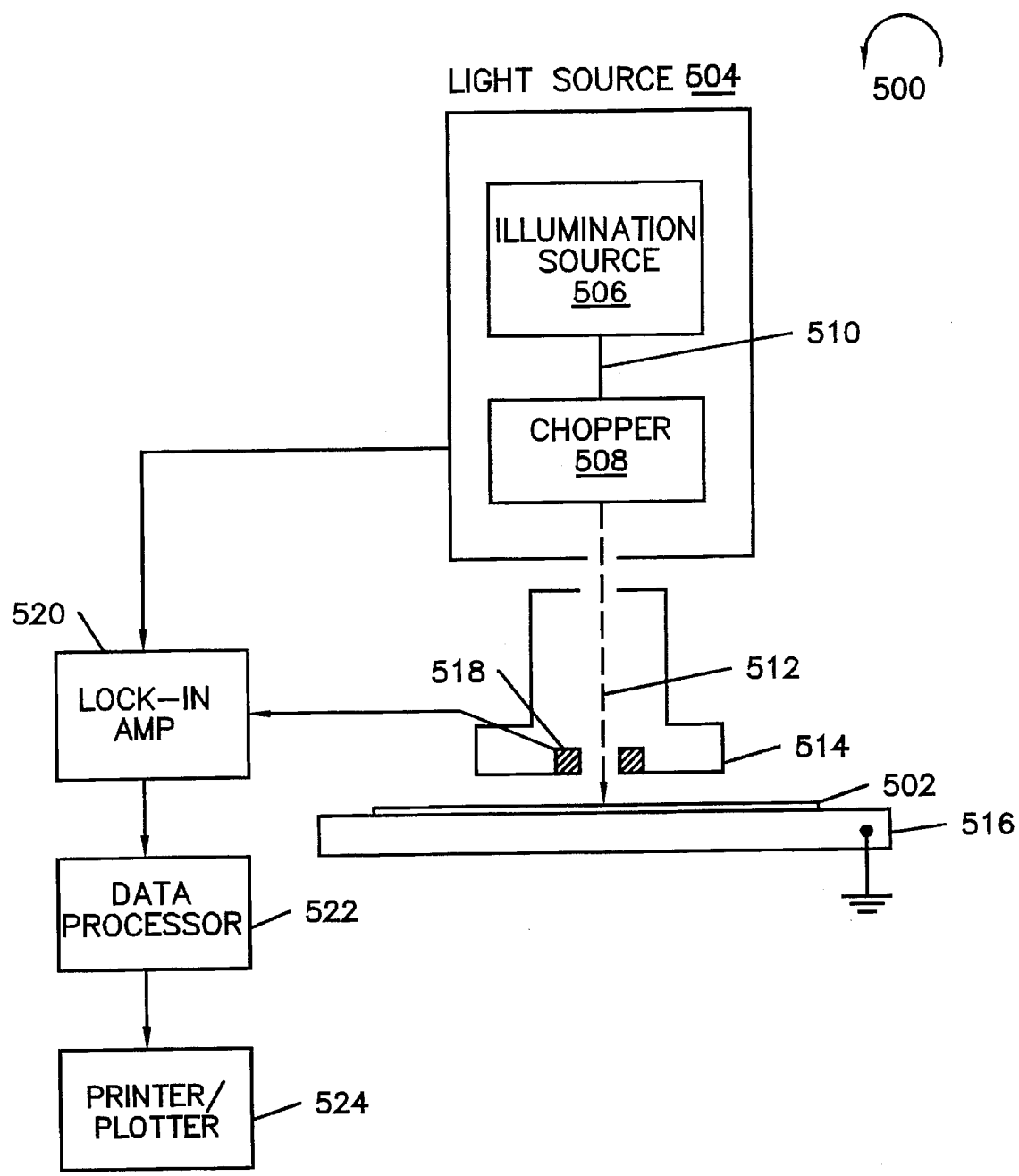
FIG. 5 shows a block diagram of a high-injection SPV frequency sweep apparatus of the present invention.

FIG. 5 shows a block diagram of a high-injection SPV frequency sweep apparatus 500 used to conduct experiments with results leading to a method of characterizing a surface and near-surface region of a semiconductor substrate 502. Light source 504 includes a laser illumination source 506 and a rotating chopper 508. Rotating chopper 508 of light source 504 modulates a beam of monochromatic laser light 510 produced by laser illumination source 506. Light source 504 thus produces a train of monochromatic laser light pulses 512, with constant photon flux, at different modulation frequencies.

The train of monochromatic laser light pulses 512 passes through a housing 514 and strikes the surface of semiconductor substrate 502 resting on electrically grounded base plate 516. Pickup electrode 518 sends an electrical signal reflecting the level of the surface photovoltage of semiconductor substrate 502 to lock-in amplifier 520. Lock-in amplifier 520 is synchronized with rotating chopper 508 of light source 504 via an electrical signal from light source 504. Lock-in amplifier 520 provides an output signal reflecting the resultant level of surface photovoltage produced by semiconductor substrate 502 to data processor 522. Data processor 522 processes the input surface photovoltages produced at several different laser light modulation frequencies to produce surface charge values at the different laser light modulation frequencies. Data processor 522 then provides laser light modulation frequency and surface charge information electrically via output signals to printer/plotter 524. Printer/plotter 524 either prints a table of laser light modulation frequencies and associated surface charge values, or generates a graph of derived surface charge versus laser light modulation frequency by plotting each derived surface charge at the corresponding laser light modulation frequency.

In a preferred embodiment, laser illumination source 506 includes a high-intensity GaAlAs heterostructure diode dissipating approximately 0.5 watts and emitting monochromatic light with a wavelength of about 830 nm.

Figure 6:
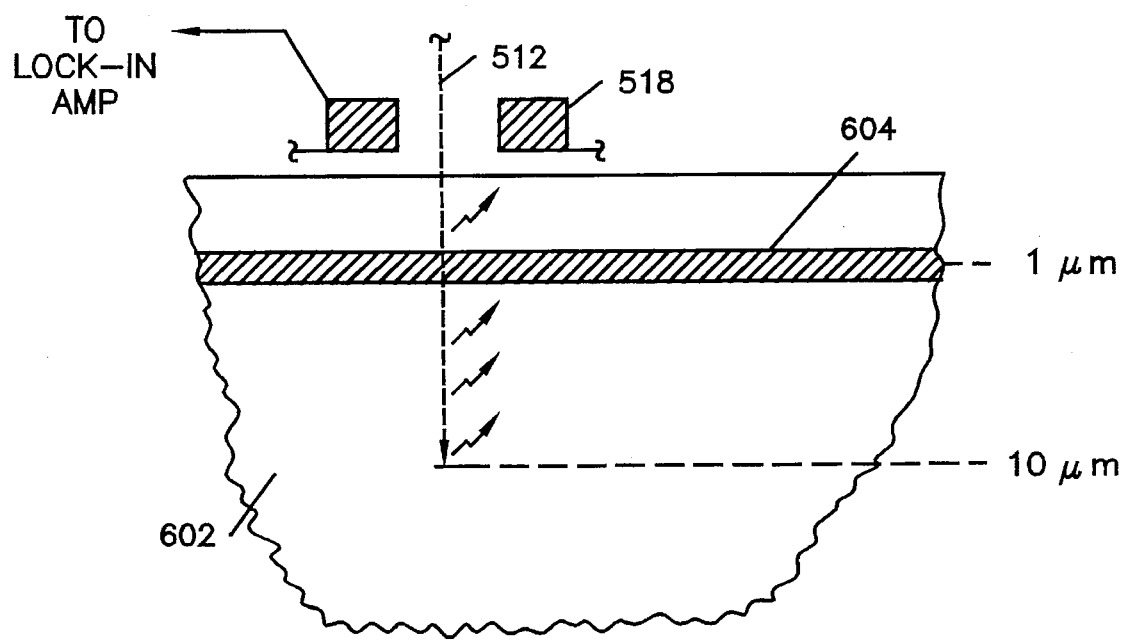
FIG. 6 shows a semiconductor substrate with a buried implant layer undergoing a high-injection SPV frequency sweep test procedure.

FIG. 6 illustrates how the method and apparatus of the present invention may be used. A semiconductor substrate 602, in which an implant layer 604 has been formed at a depth of 1 μm using high-energy (MeV) ion implantation, undergoing a high-injection SPV frequency sweep test procedure in accordance with the present invention. The train of monochromatic light pulses 512 produced by high-injection SPV frequency sweep apparatus 500 may penetrate semiconductor substrate 602 to a depth of about 10 μm as shown. The energies of incident photons may be absorbed at any point along the path of penetration of the train of monochromatic light pulses 512.

Due to the presence of the implant layer, some of the excess charge carriers produced will not reach the surface of the semiconductor substrate. The detection zone is the surface charge region which extends from the surface of the semiconductor substrate to a depth of about 80 to 100 angstroms. Only those excess charge carriers which reach the surface and enter the surface space charge region produce a surface photovoltage.

The varying modulation frequencies of the train of monochromatic light pulses 512 provide a stimulus for materials and structures within semiconductor substrate 602. The responses of these materials and structures within semiconductor substrate 602 to the stimulus provided by the train of monochromatic light pulses 512 provide valuable information concerning defects and impurities, which may lower device performance and yield, as described below.

In an experiment, four p-type <100>, 150 mm CZ bulk silicon semiconductor wafers were subjected to high-energy ion implantation of phosphorous at 1 MeV. These implantations were performed through 400 angstrom screen oxide layers on the wafer surfaces. These four wafers also contained a large background concentration of oxygen ($1.0 \times 10^{18}$ atoms/cm$^3$) in order to create a buried oxygen-rich layer with the high-energy implant. Two wafers, identification numbers 21 and 25, received buried implant doses of $5.0 \times 10^{14}$ and $1.0 \times 10^{15}$ atoms/cm$^2$, respectively, followed by a 960° C./30 min. ambient anneal. A third wafer, with identification number 5, received an 1150° C./15 min. denuding anneal in a hydrogen (H$_2$) atmosphere prior to implantation, a process that has been shown to improve gate oxide integrity and reduce p-n junction leakage currents. The wafer with identification number 5 then received a single dose of $5.0 \times 10^{14}$ atoms/cm$^2$ followed by a 960° C./30 min. ambient anneal. A fourth wafer, with identification number 24, received only a single implant dose of $1.0 \times 10^{15}$ atoms/cm$^2$ with no denuding or anneal as a reference.

After processing, each wafer was divided. Pieces of each wafer were subjected to optical, SIMS, and cross-sectional TEM (XTEM) analyses. Those pieces subjected to optical measurements also received a surface chemical analysis by vapor phase decomposition with inductively coupled plasma mass spectroscopy (VPD-ICPMS) and Fourier transform infrared (FTIR) for buried layer detection. The VPD-ICPMS and FTIR results are shown in Tables 1 and 2 below.

TABLE 1

Surface Chemistry by VPD-ICPMS.
(All measurements are times $1.0 \times 10^{11}$ atoms/cm$^2$)

| Element | Wafer Number | | | |
|---|---|---|---|---|
| | 5 | 21 | 24 | 25 |
| Na | 245.0 | 340.0 | 158.0 | 476.0 |
| Mg | 7.9 | 7.2 | 4.6 | 20.0 |
| Al | 23.0 | 13.0 | 13.0 | 24.0 |
| Ca | 36.0 | 26.0 | 19.0 | 70.0 |
| Cr | 0.5 | 0.3 | 0.2 | 0.2 |
| Mn | 0.2 | 0.2 | 0.3 | 1.1 |
| Fe | 4.9 | 2.6 | 2.1 | 1.7 |
| Ni | 0.7 | 1.2 | 0.8 | 2.1 |
| Cu | 6.3 | 7.4 | 4.4 | 16.0 |
| Zn | 2.6 | 2.9 | 2.3 | 5.4 |

TABLE 2

FTIR Interferometry Results.

| Wafer | Reflection Depth |
|---|---|
| No. 5 | 1.0 μm |
| No. 21 | 1.0 μm |
| No. 24 | (None) |
| No. 25 | 1.0 μm |

Using the apparatus of FIG. 5, all four wafers were also subjected to a high-injection SPV frequency sweep as described below in order to characterize the surface and near-surface regions. The high-injection SPV frequency sweep method was applied over a laser light modulation frequency range of 10 Hz to 100 kHz. Results measured over this range allow separation of surface charge by frequency wherein changes in measured photovoltage values (and derived surface charge) may be interpreted in order to diagnose the presence of structural and material defects affecting the characteristics of the surface and near-surface regions of the semiconductor substrate.

The method of the present invention provides a means of characterizing a surface and near-surface region of a semiconductor substrate subjected to high-energy (MeV) ion implantation through interpretation of a graph of surface charge versus the modulation frequency of incident laser light. As defined herein, the near-surface region of a semiconductor substrate extends from just below the surface of the semiconductor substrate to a depth (i.e., elevation level relative to the surface) of 0.8 μm. In general, three different frequency regimes of light modulation may be used. These frequency regimes are a low frequency regime (from about 10 Hz to about 140 Hz), medium frequency regime (from about 140 Hz to about 10 kHz), and high frequency regime (from about 10 kHz to about 100 kHz). These frequency ranges are approximate and vary with respect to substrate properties such as dopant level.

SPV measurements in the low frequency regime are typically dominated by a mobile charge ($Q_{mo}$) component. The mobile charge $Q_{mo}$ component results from mobile ionic impurities (e.g., Na$^+$, K$^+$, Li$^+$, and H$^+$) on the surface of a semiconductor substrate and in any oxide layer formed on the surface of a semiconductor substrate. Since the screen oxides present on the four wafer samples were removed after processing and before surface charge measurements were made, low-frequency surface charge measurements were most probably dominated by the mobile charge ($Q_{mo}$) component from ions residing on the wafer surface.

In the medium frequency regime, surface charge measurements made using the high-injection SPV frequency sweep method of the present invention are dependent on an interface state charge ($Q_{it}$) component. Interface state charge $Q_{it}$ exists due to the interruption of the periodic lattice structure at lattice boundaries of a semiconductor substrate. Any reduction in surface charge in the medium frequency regime is most likely due to a lack of interface states. In the medium frequency regime, defects at substrate boundaries capture minority carriers when illuminated, and release them by thermal generation when the light is off. Therefore the rate at which the surface charge is reduced in the medium frequency regime may be inversely related to the concentration of interface states.

Surface charge values derived from surface photovoltage measurements made using the high-injection SPV frequency sweep method of the present invention in the high frequency regime are dominated by saturation with very little change in surface photovoltage. In the high frequency regime, few charge carriers are generated or released during the ultra-short periods of illumination and non-illumination.

Figure 7A:
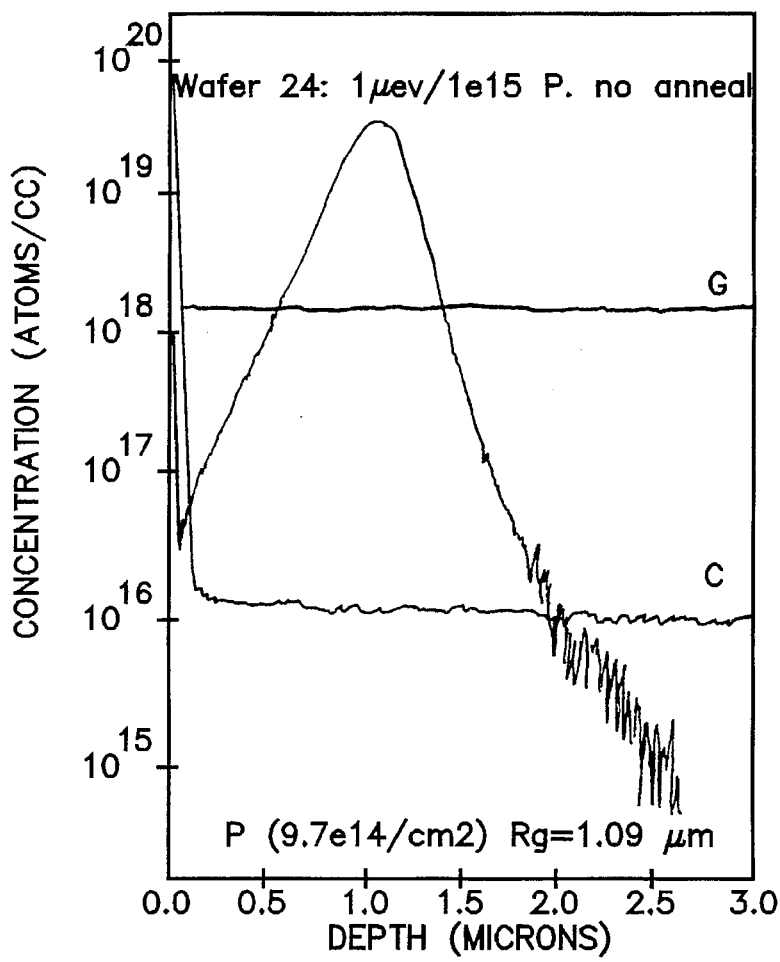
FIG. 7a shows the SIMS plot of a semiconductor wafer with identification number 24 used in a high-injection SPV frequency sweep experiment.

As stated above, wafer number 24 was the only wafer of the four which did not receive an anneal of any type, and was characterized in the as-implanted condition. FIG. 7a shows a SIMS plot of wafer number 24. This typical SIMS plot shows concentrations of oxygen (O), carbon (C), and phosphorous dopant (P), in atoms/cm$^3$, versus the depth from the wafer surface in microns. As expected, the level of implanted phosphorous (P) peaks at a depth of approximately 1.0 μm. The background level of oxygen (O) remains at an initial value of about $1.0 \times 10^{18}$ atoms/cm$^3$ in the bulk and over $1.0 \times 10^{20}$ atoms/cm$^3$ in the near-surface region. The background level of carbon (C) remains at an initial value of about $1.0 \times 10^{16}$ atoms/cm$^3$ in the bulk and over $1.0 \times 10^{20}$ atoms/cm$^3$ in the near-surface region. Assuming the optically-generated space-charge region extends from the surface to a depth of about 80 angstroms, the environment in which surface charge measurements were made included the elevated oxygen concentration near the surface. An XTEM profile of wafer number 24 showed no obvious defect regions. This XTEM result is consistent with the theory of high-energy ion implantation. The SIMS and XTEM results revealed the creation of an implanted phosphorous layer with no heavily damaged (i.e., amorphous) near-surface layer typical of lower energy ion implantation. The FTIR results also confirmed that no defect layer existed.

Figure 7B:
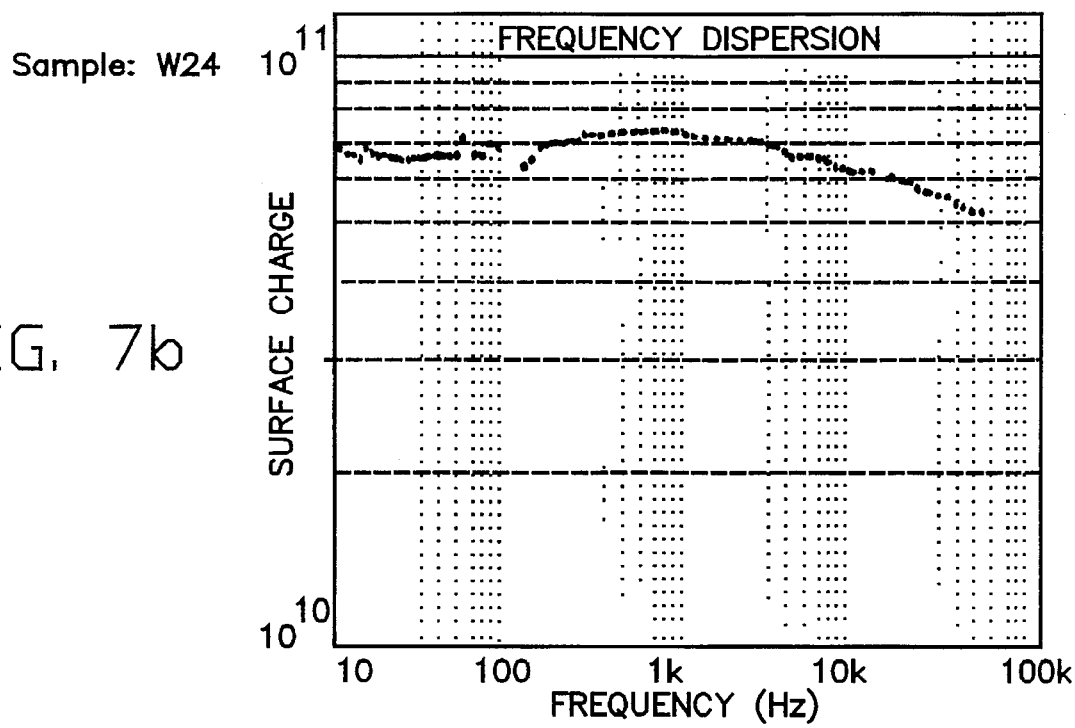
FIG. 7b shows a graph of surface charge versus modulation frequency for a semiconductor wafer with identification number 24 used in a high-injection SPV frequency sweep experiment.

FIG. 7b shows a high-injection SPV frequency sweep of wafer number 24 in accordance with the present invention. The pattern of FIG. 7b is consistent with that of new, unprocessed wafers with an average charge level of 6 Q/cm$^2$. The charge level may easily be traced to the large amounts of ionic species shown in Table 1 above which represents the chemical state of the surface of the as-implanted, non-annealed wafer. In particular, it is noted that the concentrations of all species listed are the lowest of all four wafers, making it possible to isolate contributions from the annealing process.

In general, the most important observation of the SPV data of FIG. 7b is the consistent surface charge level throughout the medium frequency regime (140 Hz–10 kHz) which is typically dominated by the generation lifetime response. The lack of a roll-off of surface charge at frequencies of less than 5 kHz is indicative of a high $Q_{it}$ (i.e., a very high concentration of interface states). This may be explained by the presence of an oxygen-rich near-surface region. An additional check of the XTEM profile showed few observable lattice defects, providing a reasonable confirmation of the observation. It will also be noted that measured surface charge rolls off rather slowly in the high frequency regime (10 kHz–100 kHz).

Figure 8A:
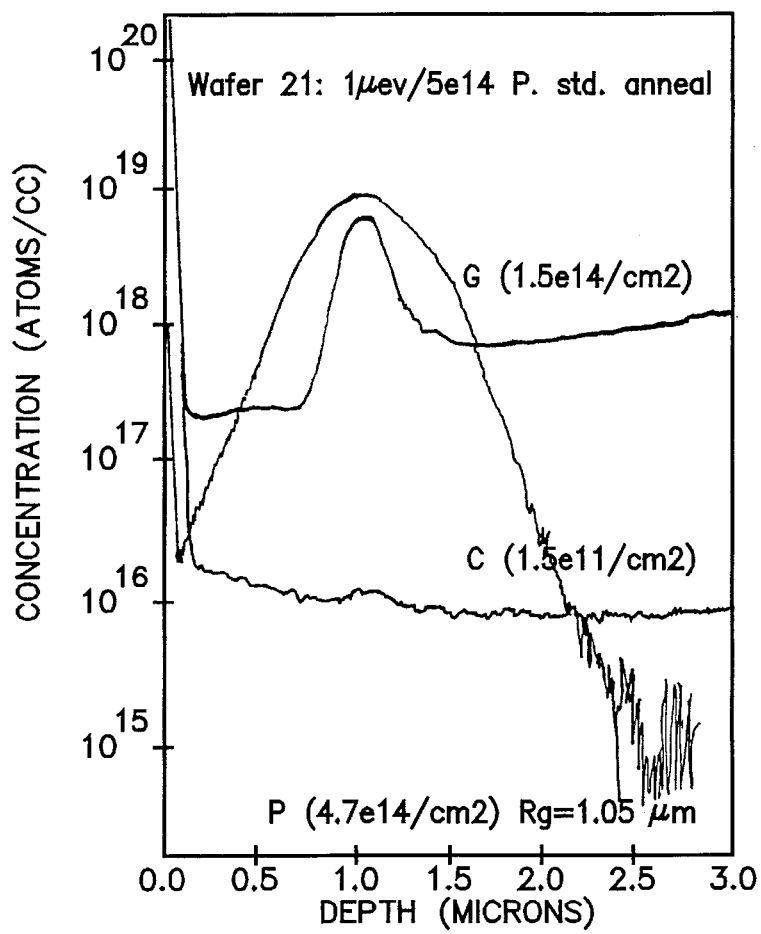
FIG. 8a shows a SIMS plot of a semiconductor wafer with identification number 21 used in a high-injection SPV frequency sweep experiment.

As described above, wafer number 21 received 1 MeV buried implant dose of $5.0 \times 10^{14}$ atoms/cm$^2$ followed by a 960° C./30 min. ambient anneal. FIG. 8a shows a SIMS profile of wafer number 21. Wafer 21 exhibited a peak in the oxygen concentration of about $5.0 \times 10^{18}$ atoms/cm$^3$ at the implant depth of 1.0 microns after anneal. This is most likely due to the gettering of oxygen at the implant depth during the annealing operation. Borland, et al., "MeV Implantation Technology: Next Generation Manufacturing with Current-Generation Equipment," Solid State Technology, December 1993, pp. 1–8 (herein incorporated by reference).

XTEM results showed that wafer 21 exhibited gettered defects at the implant depth of 1.0 micron, the region with the highest concentration of oxygen. The SIMS and XTEM results indicate that the defect layer caused by the dopant implantation gettered the surrounding oxygen precipitates, reducing the average near-surface region from about $1.0 \times 10^{18}$ atoms/cm$^3$ to about $2.0 \times 10^{17}$ atoms/cm$^3$. This indication was confirmed by interferometry results revealing a reflective layer at the implant depth.

Figure 8B:
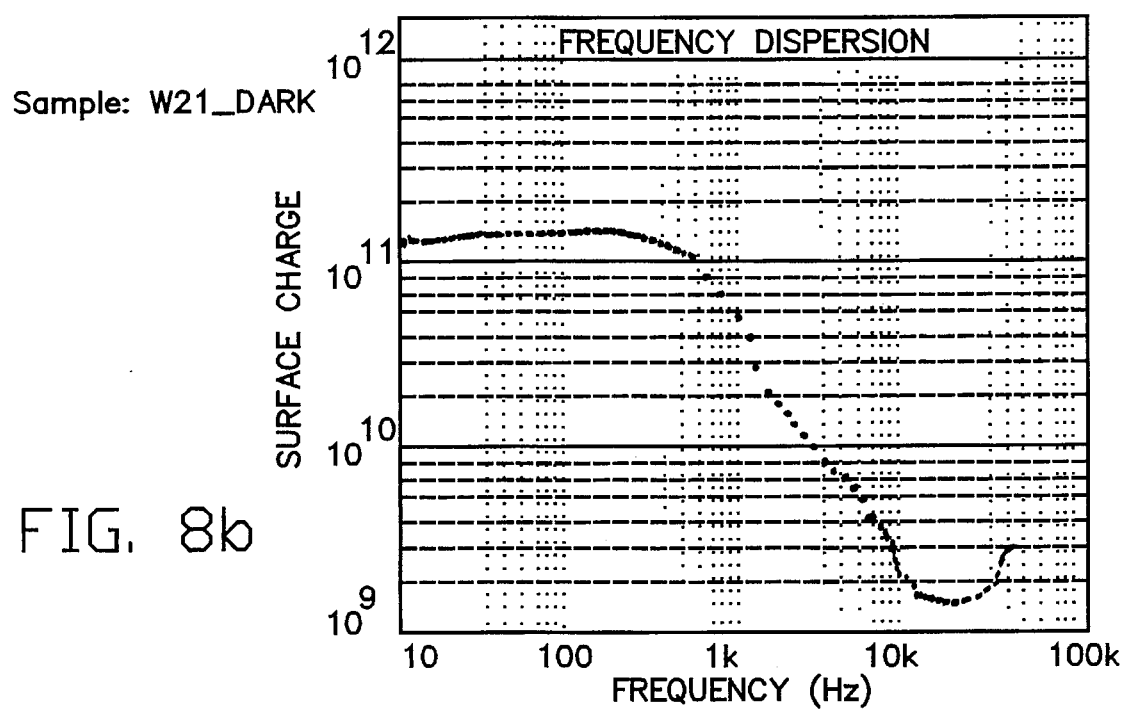
FIG. 8b shows a graph of surface charge versus modulation frequency for a semiconductor wafer with identification number 21 used in a high-injection SPV frequency sweep experiment.

FIG. 8b shows a high-injection SPV frequency sweep of wafer number 21 in accordance with the present invention. The high-injection SPV frequency sweep of wafer 21 exhibited two significant differences compared to the high-injection SPV frequency sweep of wafer 24 (FIG. 7b): 1) wafer 21 shows a higher surface charge in the low frequency regime, and 2) wafer 21 exhibits a surface charge roll-off starting at about 600 Hz in the medium frequency regime. The higher surface charge measurements at low modulation frequencies may be traced to higher concentrations of charged ionic species (most notably sodium, Na) in annealed wafers 21, 25, and 5, compared to non-annealed wafer 24. (See Table 1). This may be indicative of the use of a contaminated furnace during the annealing process. The surface charge roll-off exhibited by wafer 21 starting at about 600 Hz in the medium frequency regime is indicative of increased generation lifetime due to a reduced number of interface defects.

Figure 9A:
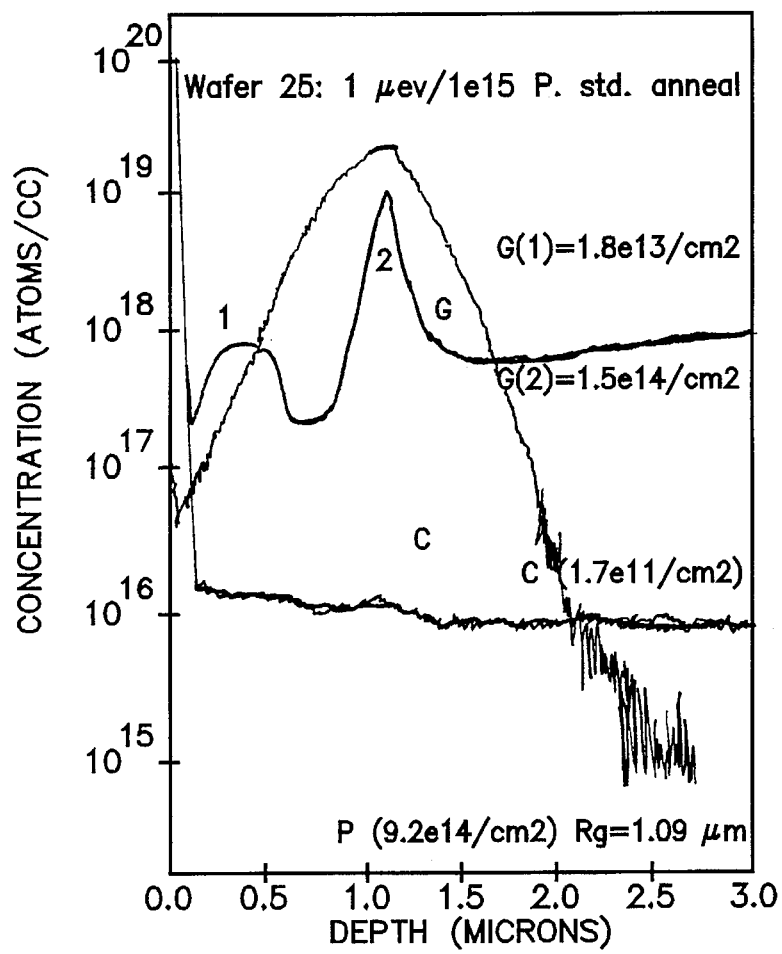
FIG. 9a shows a SIMS plot of a semiconductor wafer with identification number 25 used in a high-injection SPV frequency sweep experiment.

Wafer number 25 received a 1 MeV buried implant dose of $1.0 \times 10^{15}$ atoms/cm$^2$ followed by a 960° C./30 min. ambient anneal as described above. FIG. 9a shows a SIMS profile of wafer number 25. Wafer 25 exhibited two peaks in oxygen concentration: about $7.0 \times 10^{17}$ atoms/cm$^3$ at a depth of 0.4 microns, and about $1.0 \times 10^{19}$ atoms/cm$^3$ at the implant depth of 1.0 microns. The peak of about $7.0 \times 10^{17}$ atoms/cm$^3$ at a depth of 0.4 microns may be due to the surface injection of oxygen during the anneal, "knock-on" of oxygen from the oxide into the substrate (at higher doses), or possible vacancy filling effects. It will be noted that dopant concentration in the near-surface region and peak dopant concentration are greater in wafer number 25 than in wafer 21.

XTEM results showed that wafer 25 exhibited gettered defects at the implant depth of 1.0 micron, the region with the highest concentration of oxygen. The SIMS and XTEM results indicate that the defect layer caused by the dopant implantation gettered the surrounding oxygen precipitates, reducing the average oxygen concentration in the near-surface region from about $1.0 \times 10^{18}$ atoms/cm$^3$ to about $2.0 \times 10^{17}$ atoms/cm$^3$. This indication was confirmed by interferometry results revealing a reflective layer at the implant depth. Both FTIR and XTEM results failed to confirm the SIMS finding of a second oxygen concentration peak in wafer 25 at a depth of 0.4 microns. This may be explained by oxygen atoms filling lattice vacancies created at a depth of 0.4 microns and the absence of other crystalline defects at this depth.

Figure 9B:
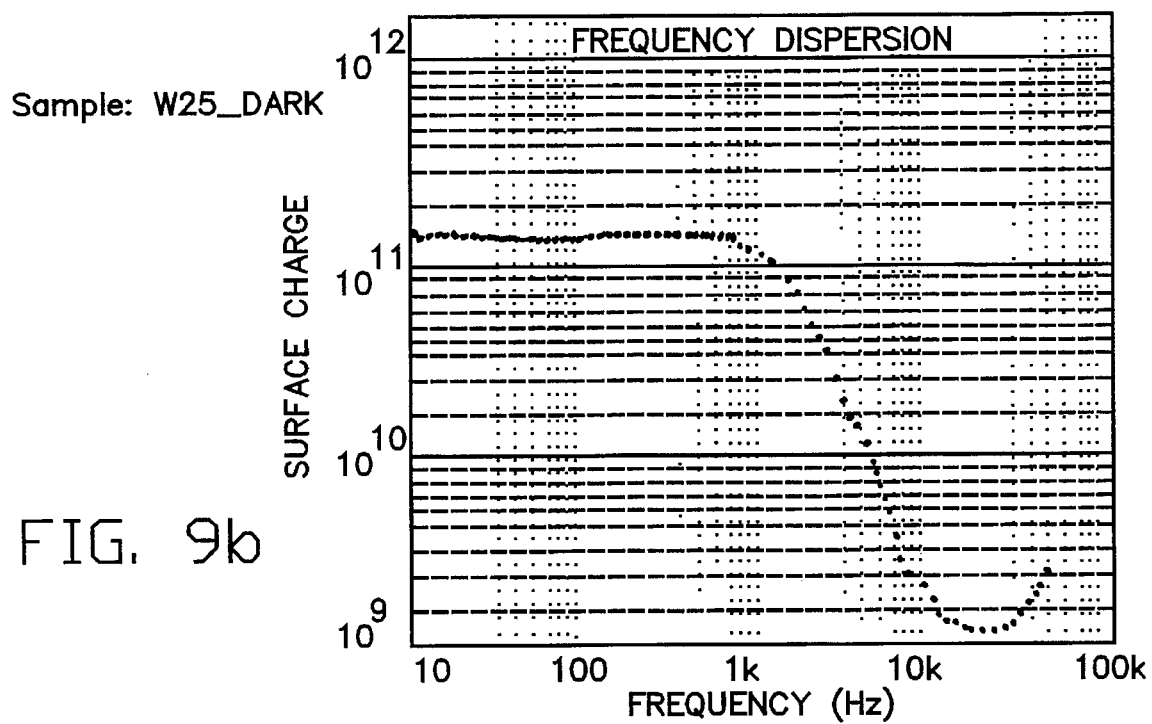
FIG. 9b shows a graph of surface charge versus modulation frequency for a semiconductor wafer with identification number 25 used in a high-injection SPV frequency sweep experiment.

FIG. 9b shows a high-injection SPV frequency sweep of wafer number 25 in accordance with the present invention. The high-injection SPV frequency sweep of wafer 25 exhibited two significant differences compared to the high-injection SPV frequency sweep of wafer 24 (FIG. 7b): 1) wafer 25 shows a higher surface charge in the low frequency regime, and 2) wafer 25 exhibits a surface charge roll-off starting at about 1.0 kHz in the medium frequency regime. The higher surface charge measurements at low modulation frequencies may again be traced to higher concentrations of charged ionic species (most notably sodium, Na) in annealed wafers 21, 25, and 5, compared to non-annealed wafer 24. (See Table 1). This may again be indicative of the use of a contaminated furnace during the annealing process. The surface charge roll-off exhibited by wafer 25 starting at about 1.0 KHz in the medium frequency regime is indicative of increased generation lifetime due to a reduced number of interface defects.

Figure 10A:
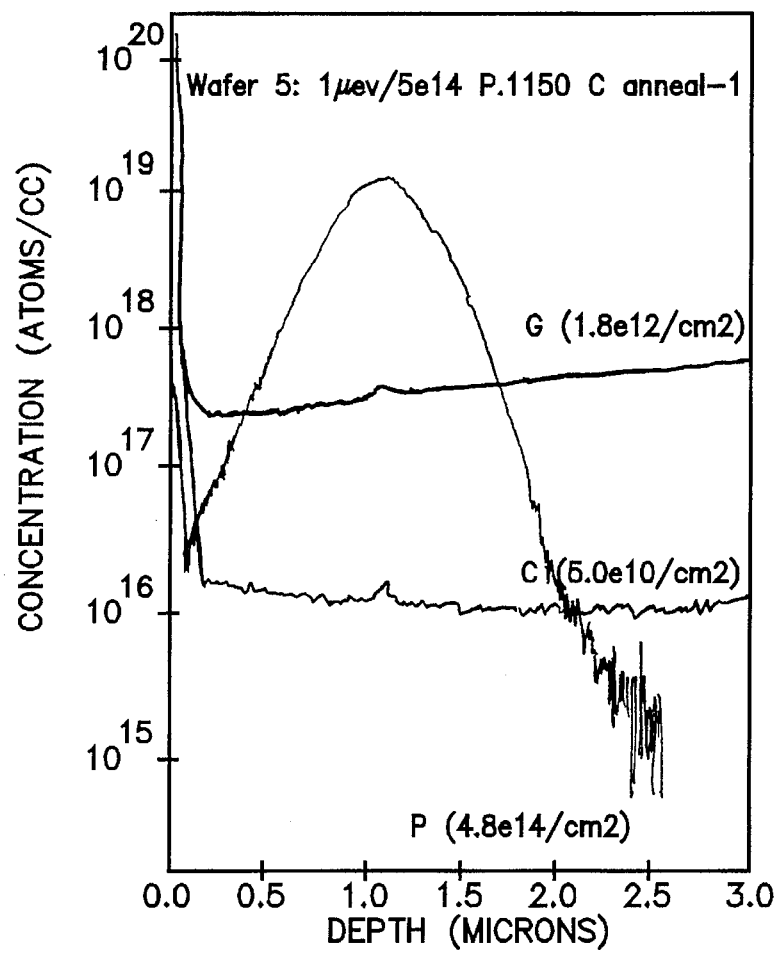
FIG. 10a shows a SIMS plot of a semiconductor wafer with identification number 5 used in a high-injection SPV frequency sweep experiment.

As described above, wafer number 5 received an 1150° C./15 min. $H_2$ denuding anneal prior to implantation. Wafer 5 then received a single dose of $5.0 \times 10^{14}$ atoms/cm$^2$ at 1 MeV followed by a 960° C./30 min. ambient anneal. FIG. 10a shows a SIMS profile of wafer number 5. Wafer 5 exhibited a single very small peak in oxygen concentration from a background level of about $2.0 \times 10^{17}$ atoms/cm$^3$ in the bulk to a level of about $3.0 \times 10^{17}$ atoms/cm$^3$ at the implant depth of 1.0 microns. The reduction in oxygen concentration at the implant depth compared to wafers 21 and 25 is most likely due to the reduction of interstitial oxygen via denudation prior to implantation and anneal.

XTEM results showed that wafer 5 exhibited gettered defects at the implant depth of 1.0 micron. The SIMS and XTEM results indicate that the defect layer caused by the dopant implantation gettered the small amount of oxygen remaining after denudation during the annealing process. This indication was confirmed by interferometry results revealing a reflective layer at the implant depth.

Figure 10B:
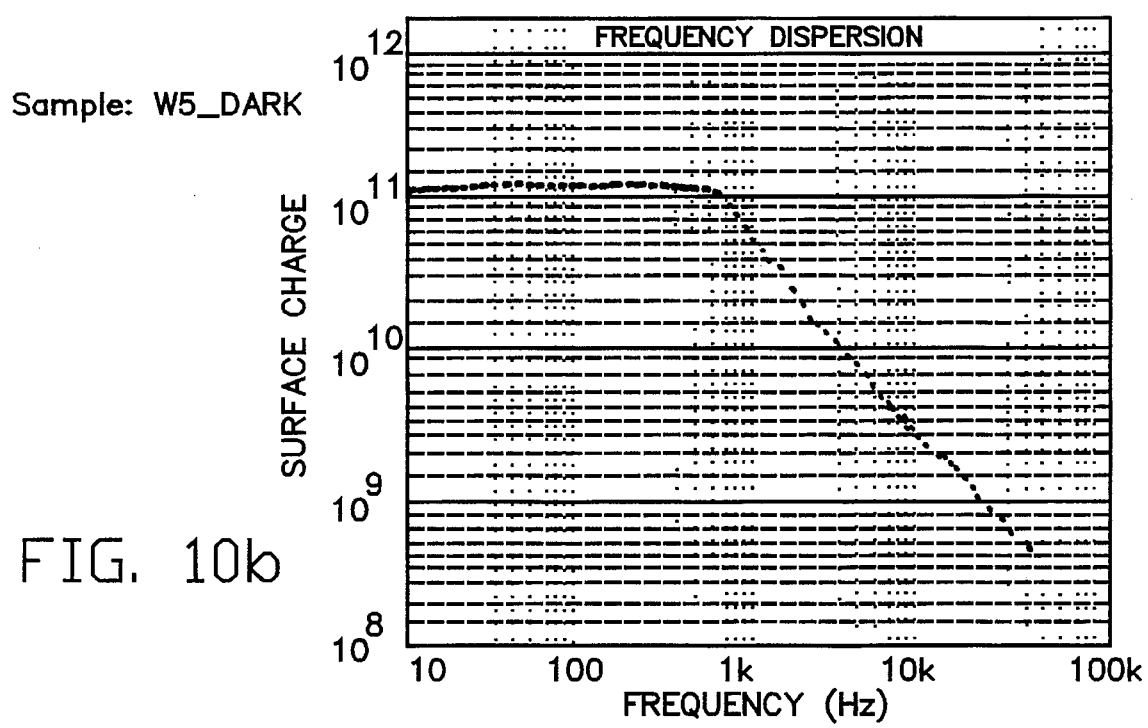
FIG. 10b shows a graph of surface charge versus modulation frequency for a semiconductor wafer with identification number 5 used in a high-injection SPV frequency sweep experiment.

FIG. 10b shows a high-injection SPV frequency sweep of wafer number 5 in accordance with the present invention. The high-injection SPV frequency sweep of wafer 5 exhibited two significant differences compared to the high-injection SPV frequency sweep of wafer 24 (FIG. 7b): 1) wafer 5 shows a higher surface charge in the low frequency regime, and 2) wafer 5 exhibits a surface charge roll-off starting at about 600 Hz in the medium frequency regime. The higher surface charge measurements at low modulation frequencies may again be traced to higher concentrations of charged ionic species (most notably sodium, Na) in annealed wafers 21, 25, and 5, compared to non-annealed wafer 24. (See Table 1). The higher concentrations of charged ionic species may be attributed to the added denudation process, or to the use of a contaminated furnace during the annealing process as before. The surface charge roll-off exhibited by wafer 5 starting at about 600 Hz in the medium frequency is again indicative of increased generation lifetime due to a reduced number of interface defects.

All four wafers 24, 21, 25, and 5 were subjected to high-energy ion implantation at 1 MeV. Wafers 21, 25, and 5 were then subjected to an annealing process, while wafer 24 was not. High-injection SPV frequency sweeps of wafers 21, 25, and 5 in accordance with the present invention all exhibit significant surface charge roll-off starting at about 1.0 KHz in the medium frequency regime, indicative of increased generation lifetime due to a reduced number of interface defects. (See FIGS. 8b, 9b, and 10b). A high-injection SPV frequency sweep of wafer 24 exhibits only a slight surface charge roll-off starting at about 1.0 kHz. (See FIG. 7b). The indication is that the annealing operation reduced interface defects due to oxygen, and these reduced interface defects result in increased generation lifetimes. To the author's knowledge, this phenomenon has never before been detected passively or reported previously.

Wafers 21 and 25 were subjected to different dopant levels at ion implant energies of 1 MeV followed by a 960° C./30 min. ambient anneals. Wafer 21 exhibited a surface charge roll-off starting at about 600 Hz in the medium frequency regime (see FIG. 8b), and wafer 25 exhibited a surface charge roll-off starting at about 1.0 kHz (see FIG. 9b). As described above, the difference in the roll-offs are indicative of reduced generation lifetimes due to an increased number of interface defects. Since the concentrations of oxygen in the near-surface regions of wafers 21 and 25 show no appreciable differences, the greater generation lifetime reduction of wafer 25 was most likely due to an oxygen concentration peak in the near-surface region at 0.4 μm which is not present in wafer 21. The higher amount of activated dopant in the near-surface region of wafer 25 may also have contributed to the greater generation lifetime reduction of wafer 25. In addition, the fact that the difference in the amounts of oxygen in the near-surface regions of wafers 21 and 25 was small serves to demonstrate that the high-injection SPV frequency sweep of MeV implanted wafers in accordance with the present invention has the ability to sense very small shifts in surface charge and generation lifetime as a function of near-surface defects and doping.

The upturns in the high-injection SPV frequency sweeps of wafers 21 (FIG. 8b) and 25 (FIG. 9b), starting at modulation frequencies of about 20 kHz, are most likely due to the gettering of oxygen precipitates which create a carrier interference effect at the high end of the pinned flat band region. This is due to recombination lifetime at these higher frequencies. Denuded wafer 5 did not have this large precipitate defect region. The inversion of the high-injection SPV frequency sweeps of wafers 21 and 25 in the high frequency regime may thus be attributed to the annihilation of carriers by the high concentration of gettered oxygen precipitates at the implant depths.

The similarities between the high-injection SPV frequency sweeps of wafers 21 (FIG. 8b) and 5 (FIG. 10b) in the low and medium frequency regimes, and differences in the high frequency regime, are important observations. Both wafer 21 and wafer 5 received a single dose of $5.0 \times 10^{14}$ atoms/cm$^2$ at 1 MeV followed by a 960° C./30 min. ambient anneal. The similarities in the high-injection SPV frequency sweeps of wafers 21 and 5 in the low frequency regime are most likely due to higher concentrations of charged ionic species as described above and/or the lack of a second peak in oxygen concentration.

The high-injection SPV frequency sweeps of wafers 21 (FIG. 8b) and 5 (FIG. 10b) both exhibit surface charge roll-off starting at about 1.0 KHz in the medium frequency regime, indicating similarly reduced generation lifetimes due to increased numbers of interface defects. Thus the generation lifetimes in the surface and near-surface regions of the semiconductor wafers used in this experiment appear to be independent of any $H_2$ denudation process performed prior to implant and anneal.

The high-injection SPV frequency sweeps of wafers 21 (FIG. 8b) and 5 (FIG. 10b) differ mainly in high frequency regime. The high-injection SPV frequency sweep of wafer 21 shows an upturn in surface charge starting at about 20 kHz, and the high-injection SPV frequency sweep of wafer 5 does not. The fact that both wafers received equivalent doping levels tends to rule out a possible contribution from dopant level. The fact that wafer 21 had a peak in oxygen concentration at the implant depth of 1.0 microns, and wafer 5 did not, helps support the theory that the inversion of the high-injection SPV frequency sweep of wafer 21 in the high frequency regime may be due to the annihilation of carriers by the high concentration of gettered oxygen precipitates at the implant depth.

The description of the above experiment reveals the use of a method and apparatus for the characterization of surface and near-surface regions of semiconductor substrates subjected to high-energy (MeV) ion implantation. The results of this experiment show that plots of surface charge versus modulation frequency of a high-injection illumination source in accordance with the present invention may be effectively interpreted to diagnose the presence of structural and material defects which affect the characteristics of surface and near-surface regions of an as-processed semiconductor substrate.

It will be appreciated to those skilled in the art after having the benefit of this disclosure that this invention is believed to be capable of providing a fast, efficient, non-contact, non-destructive means of characterizing surface and near-surface regions of a semiconductor substrate subjected to high-energy (MeV) ion implantation through interpretation of a graph of surface charge versus modulation frequency of incident monochromatic light. Furthermore, it is also to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and change and, accordingly, the specification and drawings are to be regarded in an illustrative rather than a restrictive sense.

What is claimed is:

1. A method of characterizing a surface and a near-surface region of a semiconductor substrate subjected to a previous high-energy ion implantation procedure, comprising the steps of:

radiating an exposed surface of the semiconductor substrate with a train of light pulses, said train of light pulses having a plurality of dissimilar modulation frequencies;

measuring a resultant surface photovoltage at each of the plurality of dissimilar light pulse modulation frequencies, wherein the resultant surface photovoltage is produced at the exposed surface;

deriving a resultant surface charge from the measured surface photovoltage at each of the plurality of dissimilar light pulse modulation frequencies;

forming a graph of derived surface charge versus light pulse modulation frequency by plotting each derived surface charge at the corresponding light pulse modulation frequency;

diagnosing the presence of at least one mobile ionic impurity by visually determining an average value of surface charge in a low-frequency regime, and comparing the visually determined average value to a predetermined threshold value;

diagnosing the presence of interface defects by visually determining the light pulse modulation frequency at which the graph of surface charge versus light pulse modulation frequency begins a decreasing trend in a medium-frequency regime, and comparing the visually determined light pulse modulation frequency at which a decreasing trend begins to a predetermined threshold modulation frequency; and diagnosing the presence of gettered oxygen precipitate defects by visually determining whether or not the graph of surface charge versus light pulse modulation frequency begins an increasing trend in a high-frequency regime.

2. The method as recited in claim 1, wherein the wavelength of the light comprising the train of light pulses is between 800 nanometers and 850 nanometers.

3. The method as recited in claim 2, wherein the light comprising the train of light pulses is produced by a GaAlAs heterostructure laser diode.

4. The method as recited in claim 1, wherein the modulation frequencies of the train of light pulses cover a range of 10 hertz to 100 kilohertz.

5. The method as recited in claim 1, wherein said low-frequency regime is defined by light pulse modulation frequencies extending from about 10 hertz to approximately 140 hertz.

6. The method as recited in claim 1, wherein said medium-frequency regime is defined by light pulse modulation frequencies extending from about 140 hertz to approximately 10 kilohertz.

7. The method as recited in claim 1, wherein said high-frequency regime is defined by light pulse modulation frequencies extending from about 10 kilohertz to approximately 100 kilohertz.

* * * * *